(12) United States Patent
Chiu et al.

(10) Patent No.: US 8,081,280 B2
(45) Date of Patent: Dec. 20, 2011

(54) METHOD OF PRODUCING UV STABLE LIQUID CRYSTAL ALIGNMENT

(75) Inventors: George Liang-Tai Chiu, Cross River, NY (US); Steven Alan Cordes, Yorktown Heights, NY (US); James Patrick Doyle, Bronx, NY (US); Matthew J. Farinelli, Bronx, NY (US); Minhua Lu, Mohegan Lake, NY (US); Hiroki Nakano, Shiga (JP); Ronald Nunes, Hopewell Jct, NY (US); James Vichiconti, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 1162 days.

(21) Appl. No.: 11/742,474

(22) Filed: Apr. 30, 2007

(65) Prior Publication Data
US 2008/0266502 A1    Oct. 30, 2008

(51) Int. Cl.
*G02F 1/1337*     (2006.01)
*G02F 1/141*      (2006.01)
*G02F 1/1335*     (2006.01)

(52) U.S. Cl. ............. 349/136; 349/5; 349/125; 349/187

(58) Field of Classification Search .............. 349/5–10, 349/125, 134, 136, 187
See application file for complete search history.

(56) References Cited

U.S. PATENT DOCUMENTS

| | | | | |
|---|---|---|---|---|
| 5,808,717 | A | * | 9/1998 | Van Aerle ............... 349/129 |
| 6,124,914 | A | * | 9/2000 | Chaudhari et al. ....... 349/129 |
| 6,195,146 | B1 | * | 2/2001 | Chaudhari et al. ....... 349/124 |
| 6,346,975 | B2 | * | 2/2002 | Chaudhari et al. ....... 349/124 |
| 2002/0180909 | A1 | * | 12/2002 | Lubart et al. ............ 349/113 |
| 2005/0259204 | A1 | * | 11/2005 | Ham ....................... 349/124 |

* cited by examiner

*Primary Examiner* — Brian M. Healy
*Assistant Examiner* — Michael Inadomi
(74) *Attorney, Agent, or Firm* — Daniel P. Morris; David Aker (57) ABSTRACT

In a liquid crystal display device, a method for creating desirable pretilt angle by means of topography of the substrates, such as a surface that is sloped with respect to the surface of the electrodes. In combination with a low pretilt but highly photo-stable alignment layer, which may be very resistant to high levels of ultraviolet radiation, a high pretilt and photo-stable alignment structure is generated, by essentially combining two incompatible technical approaches. The ever more stringent requirements for projection displays are met. The methods for producing such sloped surfaces and the considerations related to design of the sloped surfaces are disclosed.

22 Claims, 10 Drawing Sheets

METHOD OF PRODUCING UV STABLE LIQUID CRYSTAL ALIGNMENT

BACKGROUND OF THE INVENTION

1. Field of the Invention

The present invention relates to high pretilt and photo-stable liquid crystal displays. More particularly, it relates to a method for meeting the ever more stringent requirements for liquid crystal devices used in projection applications.

1. Background Art

The alignment of liquid crystal display degrades under intense photo irradiation in projection displays. The problem becomes worse when the size of the display is smaller and the brightness of the display is higher. The photo-stability of the liquid crystal display has becoming a major barrier preventing projection liquid crystal displays from entering high-end display market such as HDTV and digital cinema. Recent improvements of polyimide, which is the industrial standard of liquid crystal displays, has extended the lifetime of the liquid crystal from 5-8 MJ/cm2 to about 12-15 MJ/cm2. However, it is still not enough. A test conducted in early 2003 revealed that the LCD projectors failed in 3-4 weeks with 24/7 operation. Therefore, the quest for a photo-stable alignment technology is very important for the LCD projection industry. In addition to photostability, fast response time is another requirement for projection displays to be used for video applications. Higher pretilt angle, the angle between liquid crystal molecules and substrates when no electrical field is applied to the display, is one of the most common approaches used to enhance response time. Usually, the alignment with high pretilt is not stable. Therefore, a photo-stable and high pretilt homogeneous alignment remains a challenge for projection liquid crystal displays.

In U.S. Pat. No. 6,195,146, a liquid crystal display cell includes a first substrate; a second substrate; a liquid crystal layer of liquid crystal molecules disposed between the first substrate and the second substrate; a first alignment layer disposed between the first substrate and the liquid crystal layer; and a second alignment layer disposed between the second substrate and the liquid crystal layer. A surface of at least one alignment layer is bombarded by a particle beam of an adjustable energy using a voltage less than 200 volts so that the liquid crystal molecules proximate the surface are induced to a predetermined pretilt angle.

U.S. Pat. No. 6,124,914 teaches a method of generating a patterned alignment direction on an alignment surface for a liquid crystal display cell. The cell is formed by forming a first alignment direction on an alignment surface, such as a polyimide surface of the cell. A second alignment direction is formed on the alignment surface. The first and second alignment directions are formed by a variety of sequences of treatments. An example of a first sequence is a first step of rubbing the alignment surface and thereafter a second step of selectively exposing (preferably using a mask) the alignment surface to a treatment selected from exposure to electromagnetic radiation and exposure to a particle beam. Another example of a sequence is a first step of exposing the alignment surface to a treatment selected from electromagnetic radiation and a particle beam and thereafter selectively exposing (preferably through a mask) the alignment surface to another particle beam.

In U.S. Pat. No. 6,346,975, a liquid crystal display device has first and second substrates, a first electrode layer overlying one surface of the first substrate, and a second electrode layer overlying one surface of the second substrate. A first alignment layer overlies the first electrode layer, and a second alignment layer overlies the second electrode layer, and a liquid crystal material is disposed between the alignment layers. In one preferred embodiment, each alignment layers is a polyimide layer. This patent also teaches a method for manufacturing a liquid crystal display device. According to the method, first and second substrates are provided, a first electrode layer is deposited over the first substrate, and a second electrode layer is deposited over the second substrate. A first alignment layer is deposited over the first electrode layer, and a second alignment layer is deposited over the second electrode layer. The first and second substrates are arranged so that the alignment layers face one another and a space is formed between the substrates. A liquid crystal material is disposed in the space between the first and second substrates.

The general teachings of these patents is incorporated herein by reference.

SUMMARY OF THE INVENTION

It is an object of the invention to provide a cost effective and simple method for producing relatively high pretilt alignment surfaces for liquid crystal molecules in liquid crystal display devices used in high intensity illumination environments.

It is another object of the invention to provide a method for providing alignment structures that are highly stable under prolonged exposure to high light intensity irradiation.

It is a further object of the invention to provide liquid crystal display devices made in accordance with the method.

The present invention is directed to a method of creating a desirable pretilt angle by means of topography of the substrates, such as a sloped surface with respect to the surface of the electrodes. In combination with a low pretilt but highly photo-stable alignment layer, a high pretilt and photo-stable alignment is generated. The invention enables the coexistence of the two incompatible technical approaches, and combines their merits to meet the ever more stringent requirements for projection displays. The invention is directed to a method for producing such sloped surface and to a liquid crystal device including such structures.

The invention is directed to a method for providing pre-tilt for liquid crystal molecules in a liquid crystal display, comprising forming a sloped surface on a substrate of the display, the sloped surface being in contact with liquid crystal molecules and causing pre-tilt of the molecules. The sloped surface may be treated to increase per-tilt angle of the molecules. The treatment may comprise depositing an alignment layer over the sloped surface. The alignment layer can be selected from the group consisting of $SiN_x$, SiOx, diamond like carbon film, SiC, a-Si, ITO, a dielectic material, a polymer, and an optical material.

The alignment layer can be treated with an ion beam. The ion beam can be directed so as to be perpendicular to ridges of the saw tooth and in a plane that forms an angle with respect to a plane of the substrate.

The sloped surface can be a saw-tooth structure. An alignment layer can be formed over the saw tooth structure. The saw-tooth structure can be treated with an ion beam. The ion beam can be directed to be perpendicular to ridges of the saw tooth and in a plane that forms an angle with respect to a plane of the substrate. The saw-tooth structure may be formed by etching with a linear mask, by deposition with a linear mask, by ion milling with a shadow mask or by greyscale photolithography.

The saw tooth structure may also be formed by one of angled RIE, oblique deposition of film with patterned shadow masks, molding a polymer film on the substrate, printing on the substrate, stamping the substrate, and scribing the substrate.

The dimension of the saw tooth structure can be selected to be large enough so that the liquid crystal molecules will not align along the direction of ridges of the saw tooth structure.

A dimension of a repeating unit of the saw tooth structure can be varied sufficiently so as to avoid diffraction of light.

The saw-tooth structure can be formed of a material selected from the group consisting of an organic film, a polymer, an inorganic film, and a dielectric film.

In accordance with yet another aspect, the invention is directed to a liquid crystal display comprising a first substrate; a second substrate; liquid crystal material disposed between the first substrate and the second substrate; and a sloped structure on at least one of the substrates for providing a pre-tilt to molecules of the liquid crystal material. An alignment layer can be disposed on the sloped structure. The sloped structure can comprise a saw tooth structure. The alignment layer can be disposed on the saw tooth structure.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT

It has been discovered that PECVD or sputtered $SiN_x$ film treated by a low energy ion beam at an oblique angle produces homogeneous alignment for liquid crystal displays. Such alignment is highly photo-stable, and can sustain 180 hours of ultraviolet irradiation at 10 Mw/cm2. However, the pretilt angle of the alignment produced by $SiN_x$ is about 0-2 degrees, which is too low for many LCD applications; especially video applications.

Figure 1:
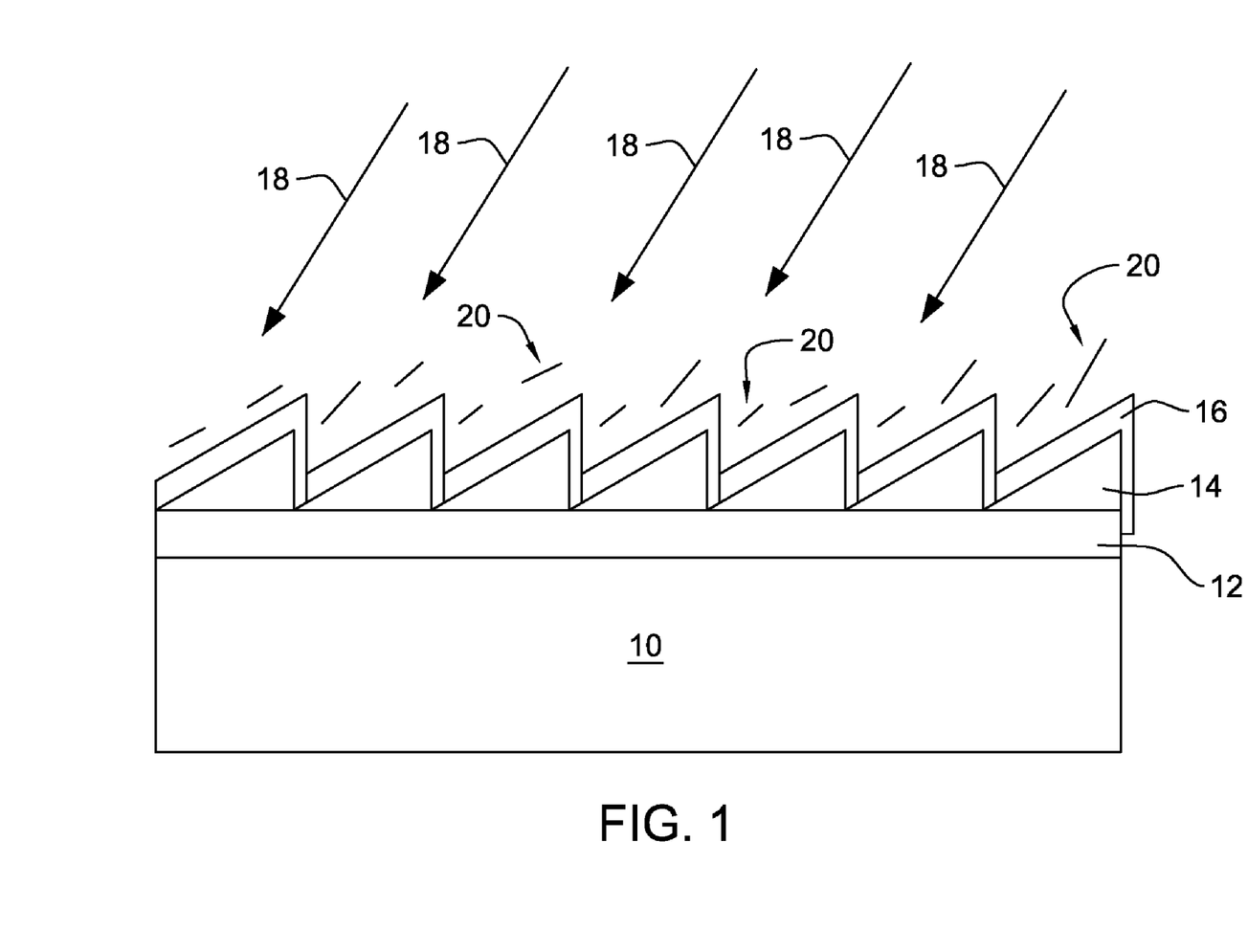
FIG. 1 is an enlarged cross-sectional view of a substrate with a saw-tooth structure on an ITO electrode and an alignment layer covering the structure.

Referring to FIG. 1, in order to solve the low pretilt angle problem, the present invention utilizes a sloped structure on a substrate 10 to raise the pretilt angle relative to the direction of the electric field mechanically. An electrode 12, which is typically an ITO layer, is formed on substrate 10. A saw-tooth layer 14 is deposited on electrode 12. An alignment layer 16, such as a sputtered $SiN_x$ film, is deposited on the saw-tooth layer 14. An ion beam, represented by 18 is directed generally along the direction of the slope of saw-tooth layer 14. The liquid crystal molecules 20 wind up with a relatively high pre-tilt angle.

Figure 1A:
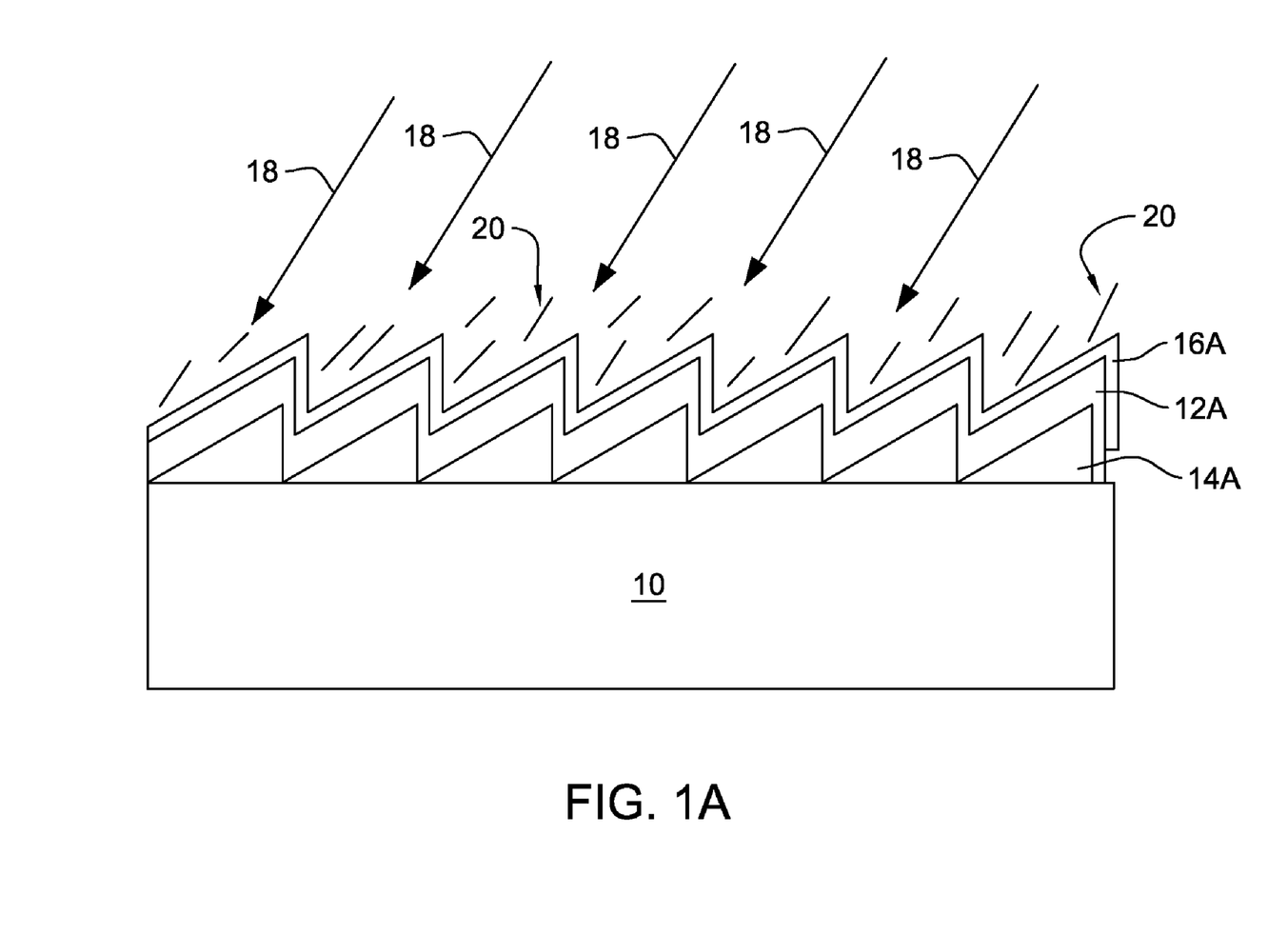
FIG. 1A is an enlarged cross-sectional view of a substrate with a saw-tooth structure and an ITO electrode, and an alignment layer covering the structure.

In FIG. 1A, a saw-tooth layer 14A is formed on substrate 10. An electrode 12A is formed on saw-tooth layer 14A. An alignment layer 16A, such as a sputtered $SiN_x$ film, is deposited on electrode 12A. In the description that follows, much of what is said with respect to electrode 12, saw-tooth layer 14 and alignment layer 16 (FIG. 1) applies to electrode 12A, saw-tooth layer 14A and alignment layer 16. (FIG. 1A).

Figure 2:
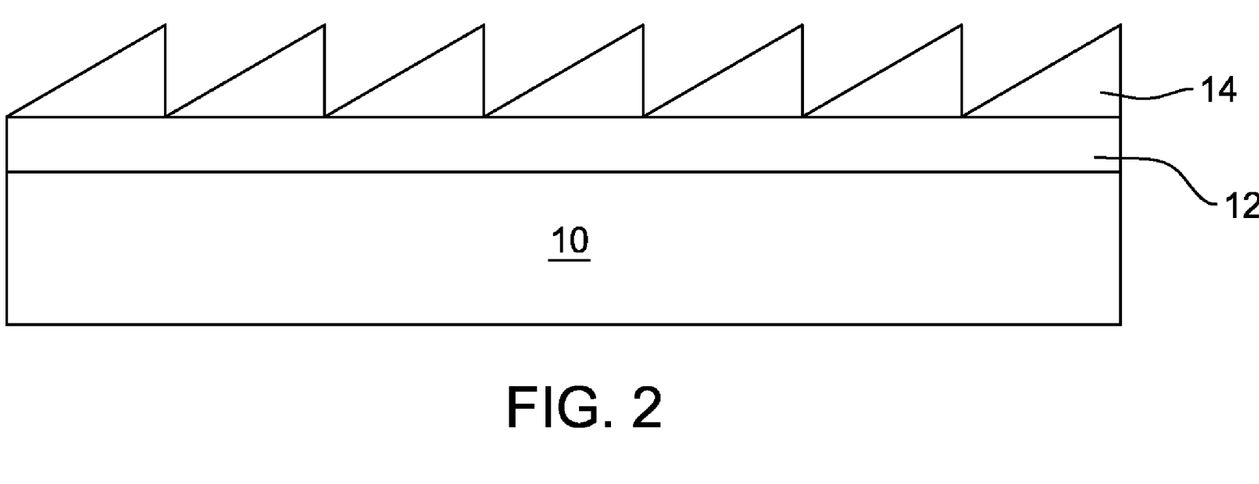
FIG. 2 is an enlarged cross-sectional view that illustrates a first step in the fabrication of a saw-tooth structure.

FIG. 2 illustrates the formation of saw-tooth layer 14 on electrode 12, which is in turn on substrate 10.

Figure 3:
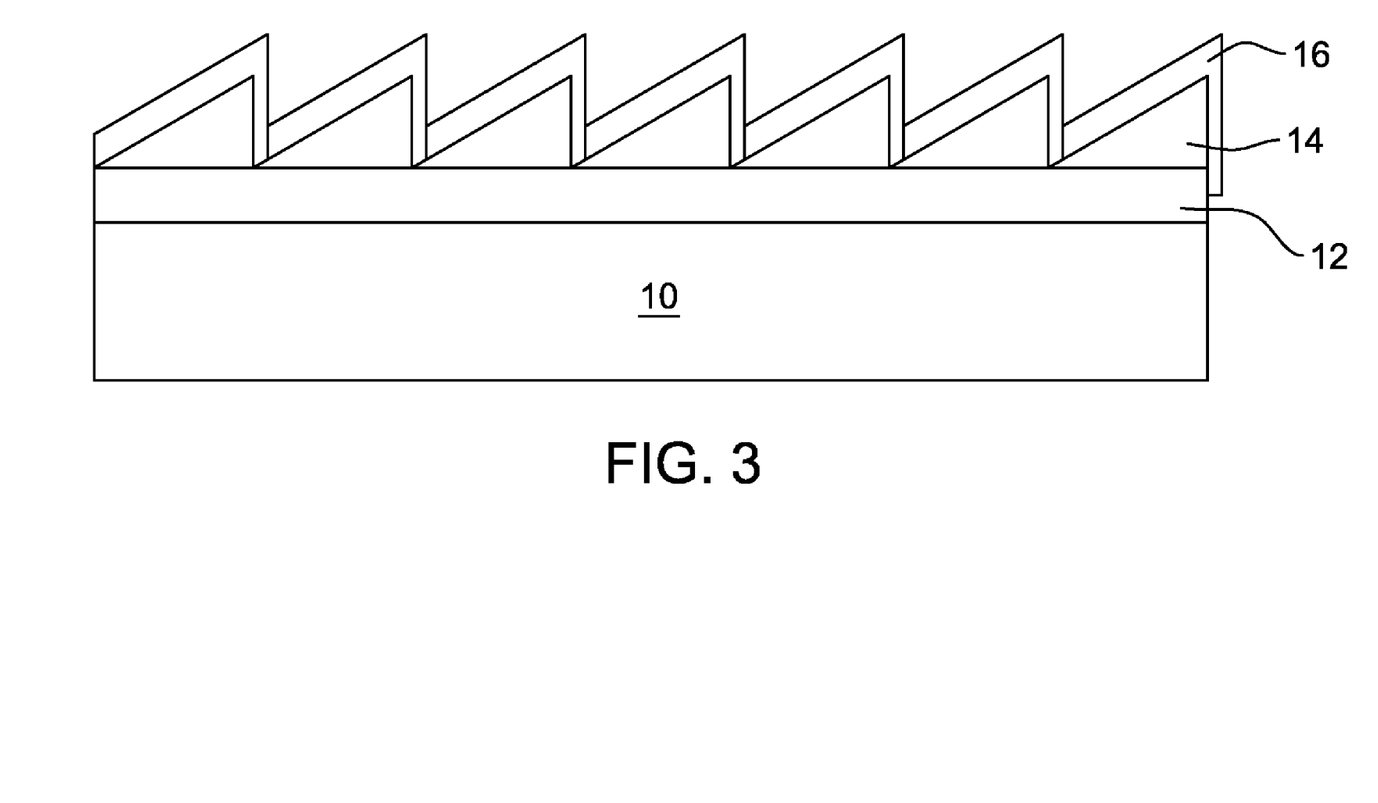
FIG. 3 is an enlarged cross-sectional view that illustrates a second step in the fabrication of a saw-tooth structure; the deposition of an alignment film.

FIG. 3 illustrates alignment layer 16 formed on saw-tooth layer 14. Alignment layer 16 may comprise a $SiN_x$ film formed by sputtering or CVD process. The alignment layer may also be one of SiOx, diamond like carbon film, SiC, a-Si, ITO, dielectic material, and various optical materials and organic materials.

Figure 4:
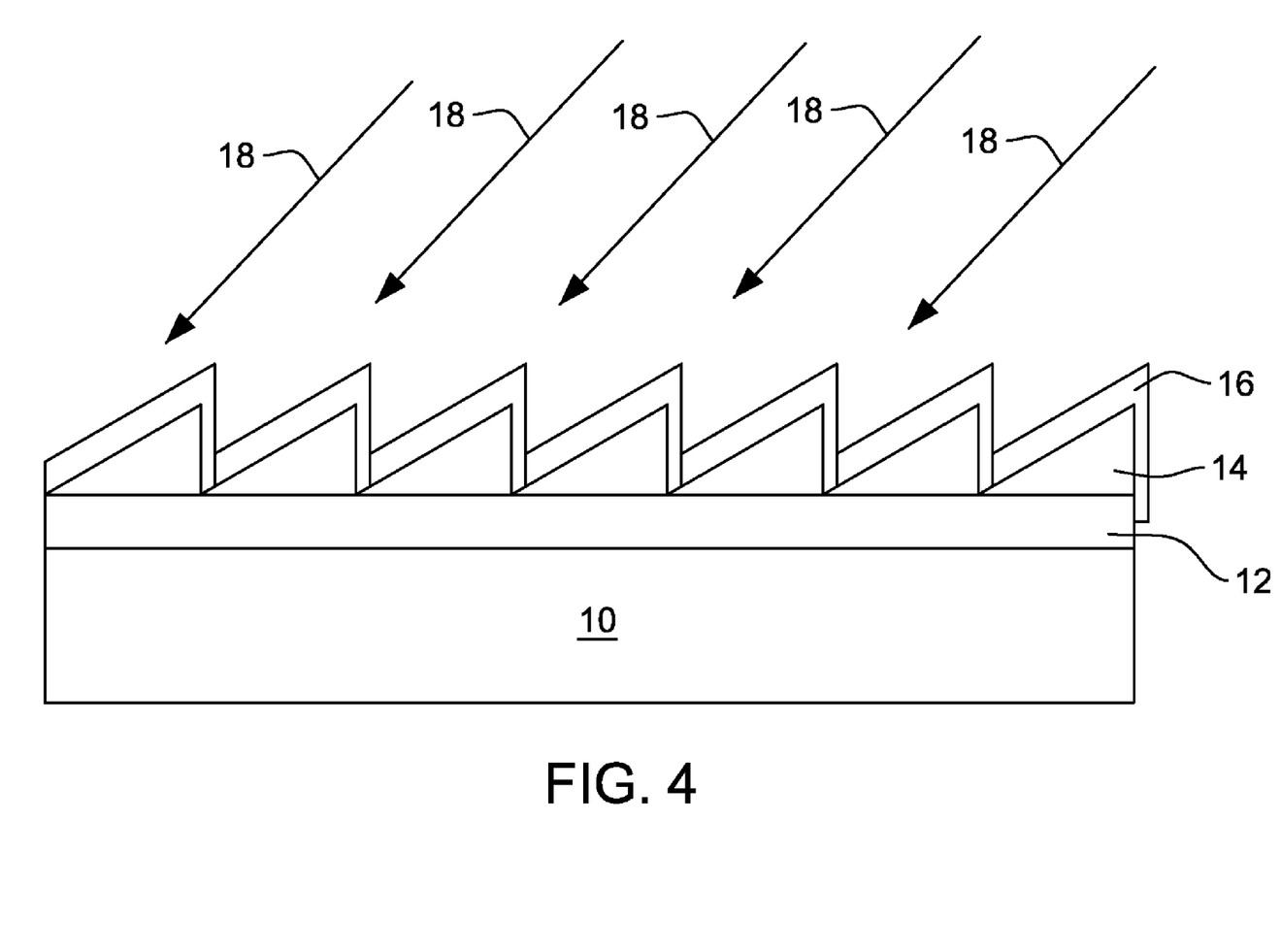
FIG. 4 is an enlarged cross-sectional view that illustrates ion beam treatment of the structure of FIG. 3.

FIG. 4 illustrates the ion beam treatment as represented by 18. The ion beam 18 is directed to be perpendicular to ridges of the saw tooth pattern and in a plane that forms an angle with respect to a plane of the substrate 10. The preferred conditions for ion beam irradiation is similar to the conditions described in U.S. Pat. No. 6,195,146.

There are several concerns about the design of such slopped alignment structures, as described above.

1. Since the thickness of the liquid crystal display is usually less than 5 microns and the slope of the structure required is at least four degrees, the slope must be divided into a saw-tooth structure to keep the difference in the height from becoming excessive.

2. In addition, since liquid crystal molecules can align along the groves, the period of the saw-tooth structure should be large enough so that the liquid crystal molecules will orient along the slope after ion beam or other directional treatment.

3. Since the LCD is an optical device, any periodic structure which can cause diffraction should be avoided. The repeating period of the structure should vary, preferably in some random manner, to eliminate diffraction effects.

4. Special precautions must be taken on the shape of the edge of the saw-tooth, to minimize the impact on electro-optical effect of the display. If it is possible, the edge of the display should be aligned with the pixel gap. For microdisplays, since the pixels are small enough, the period of the saw-tooth can be about the same as the pixel period.

5. Structures of the type described above work best with homogeneous liquid crystal mode or ECB (electrically controlled birefringence) mode, vertically aligned liquid crystal mode, hybrid alignment mode (HAN) and IPS (in plane switching) modes, but also work in TN mode.

The material for making saw-tooth structure can be organic films, polymers, inorganic films, and dielectric films. The film can be used as an alignment layer, or an alignment layer can be coated on top of the saw tooth structures.

Due to the relatively large feature size, there are many methods which can be used to fabricate the saw-tooth structure, from photolithography and direct deposition, to stamping, molding, printing, and scribing. A few of the approaches are listed below.

Angled reactive ion etch (RIE): Narrow lines are formed, having a width of much less than one micron to a depth of less than 1.5 microns. The lines are filled with a metal, which will provide good selectivity with respect to glass in the etching process. The substrate is tilted approximately 83 degrees in the RIE process, and etched using the metal filled line as a mask.

Figure 5A:
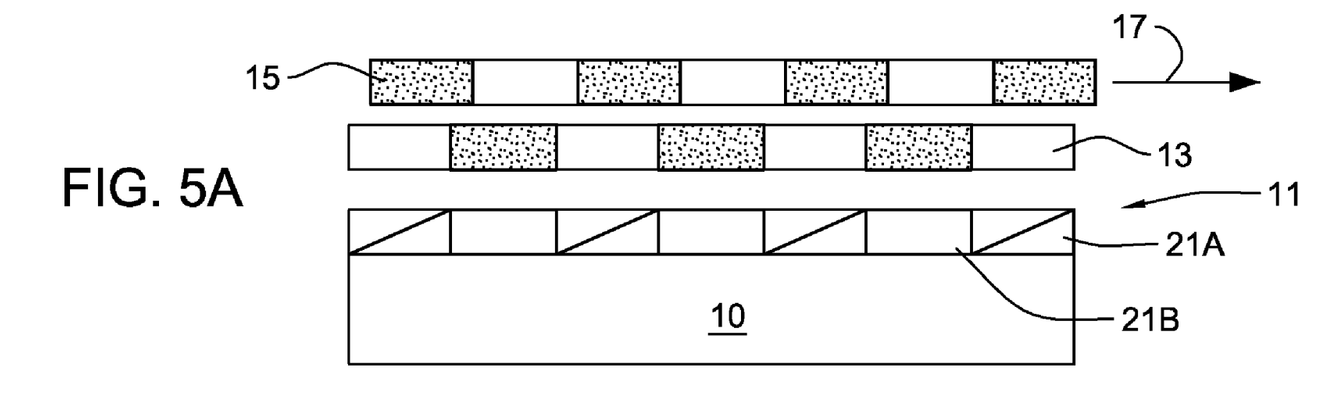
FIG. 5A and FIG. 5B are enlarged cross-sectional views that illustrate fabrication of a saw tooth structure by etching with a linear mask.
Figure 5B:
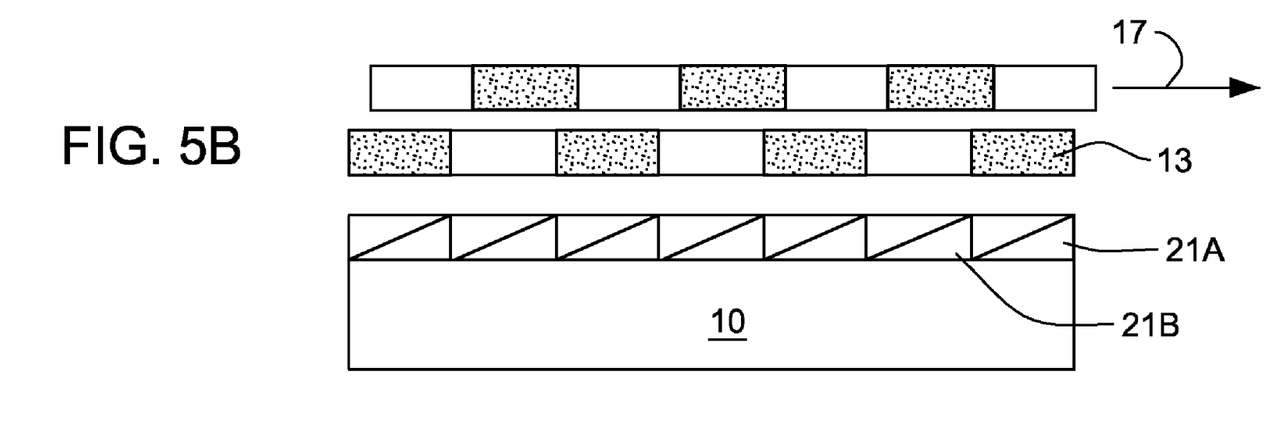

Referring to FIG. 5A and FIG. 5B, linear mask etching is performed while moving a mask. Substrate 10 has on its surface a film 11, which is to be etched. In FIG. 5A, a fixed mask 13 is placed above film 11. A moving mask 15 moves linearly in the direction of arrow 17. After etching one period, both masks 13 and 15 are shifted by one period (FIG. 5B) and etching is again performed. The regions previously etched are shielded from further etching by regions of mask 13. In FIG. 5A portions 21A of film 11 are being etched, while portions 21B are being protected. This is reversed in FIG. 5B.

Figure 6A:
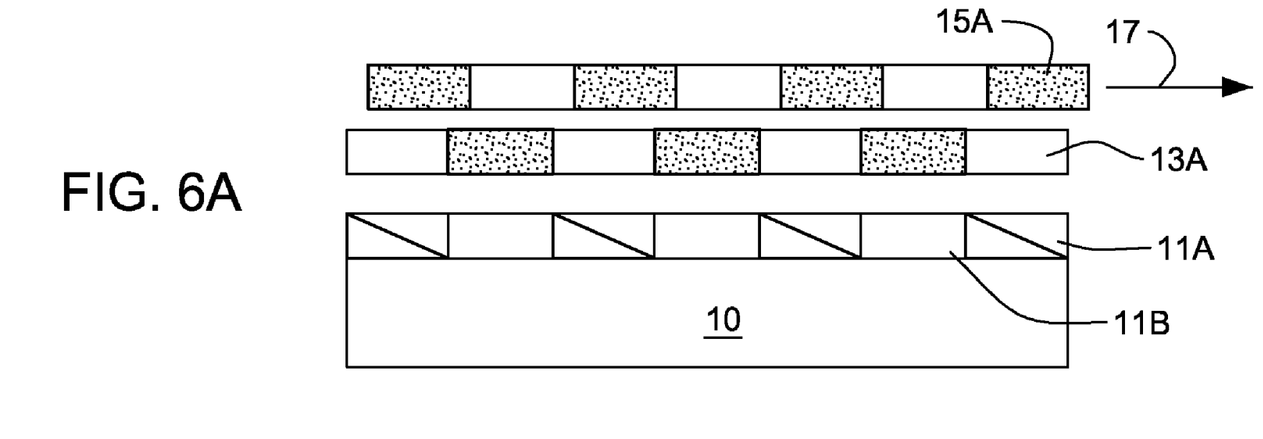
FIG. 6A and FIG. 6B are enlarged cross-sectional views that illustrate fabrication of a saw tooth structure by deposition with a linear mask.
Figure 6B:
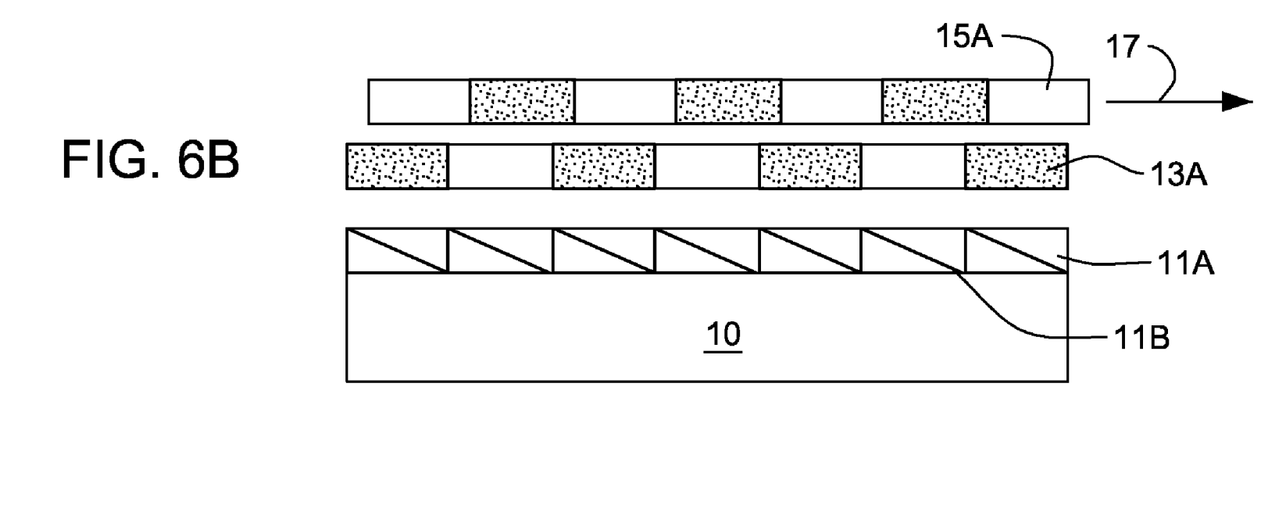

Referring to FIG. 6A and FIG. 6B, linear mask deposition is performed while moving a mask. In FIG. 6A, portions of a film 11A are deposited on substrate 10. No film is deposited in regions 11B due to blocking regions of fixed mask 13A. However, saw tooth deposition of regions 11A occurs due to motion of moving mask 15A in the direction represented by arrow 17. After deposition of one period, both masks 13A and 15A are shifted by one period (FIG. 6B) and deposition is again performed. The regions 11A previously deposited are shielded from further deposition by regions of mask 13A.

Figure 7A:
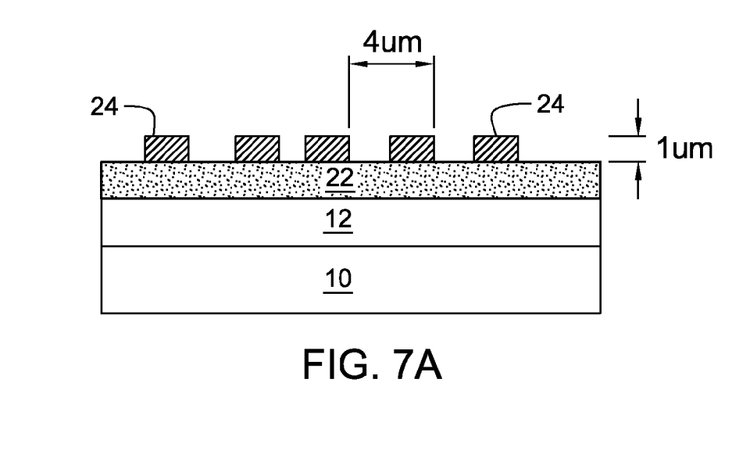
FIG. 7A to FIG. 7D are enlarged cross-sectional views that illustrate ion milling with a shadow mask.
Figure 7B:
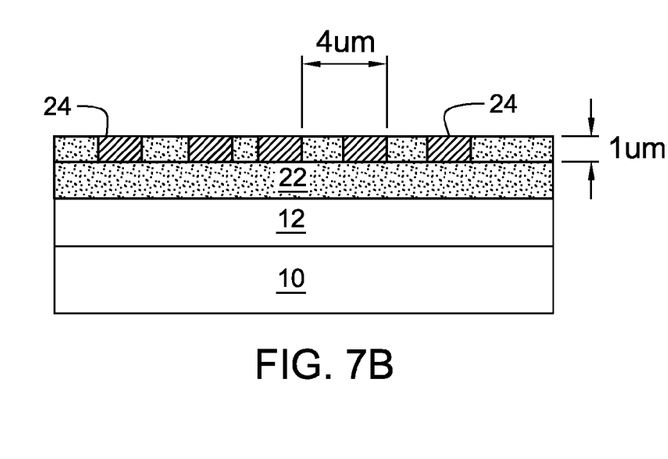
Figure 7C:
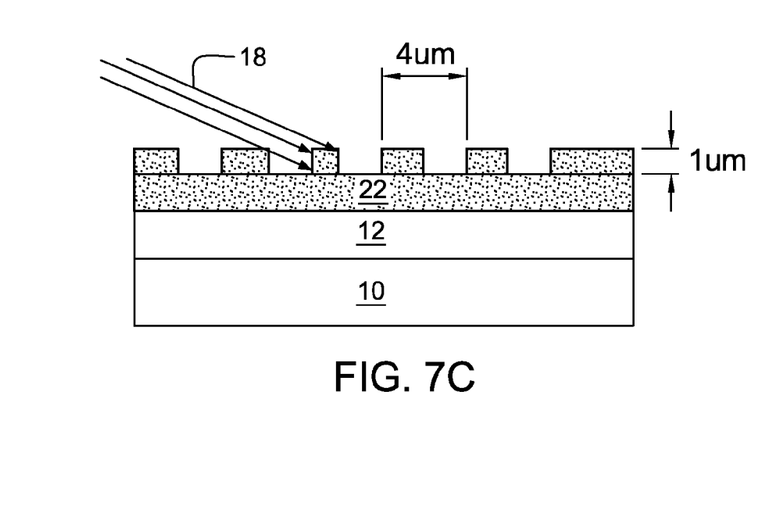
Figure 7D:
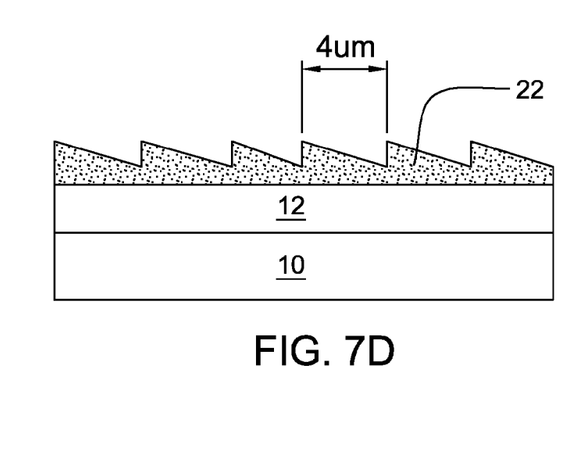

Referring first to FIG. 7A and then to FIG. 7B, FIG. 7C and FIG. 7D, ion milling with a shadow mask is performed by depositing and etching a shadow mask on top of a thin film in which the saw tooth structure is to be formed, and then ion milling at a designed oblique angle. For example to make a 14 degree, 4 micron period saw tooth structure the steps below can be followed.

1) Deposition of a 1.5 micron thick $SiN_x$ layer 22 on an electrode 12 of ITO (or directly on substrate 10), which is in turn on a substrate 10.
2) Coating of the $SiN_x$ layer 22 with a 1 micron thick photoresist layer.
3) Exposing and removing the photoresist to make stripes 24 having a width of two microns with a four micron period (50/50 ratio).
4) Depositing a one micron thick layer of $SiN_x$ over the surface of the structure of FIG. 7A to provide a conformal coating of the photoresist and the $SiN_x$.
5) Grinding or polishing of the surface to a depth of one micron to expose the buried photoresist and the $SiN_x$ in the gaps between the stripes 24. The result is shown in FIG. 7B.
6) Removing residual resist and cleaning the surface, thus leaving a striped pattern of $SiN_x$ (FIG. 7C).
7) Treating with an ion beam 18 at 26.5 degrees to the surface to mill the saw tooth structure (FIG. 7C). The resulting structure is that shown in FIG. 7D. This structure may nave somewhat rounded, rather than sharp, ridges, which for certain applications may be advantageous.

The structure of FIG. 7B can also be formed by directly etching the $SiN_x$ of FIG. 7A.

Figure 8:
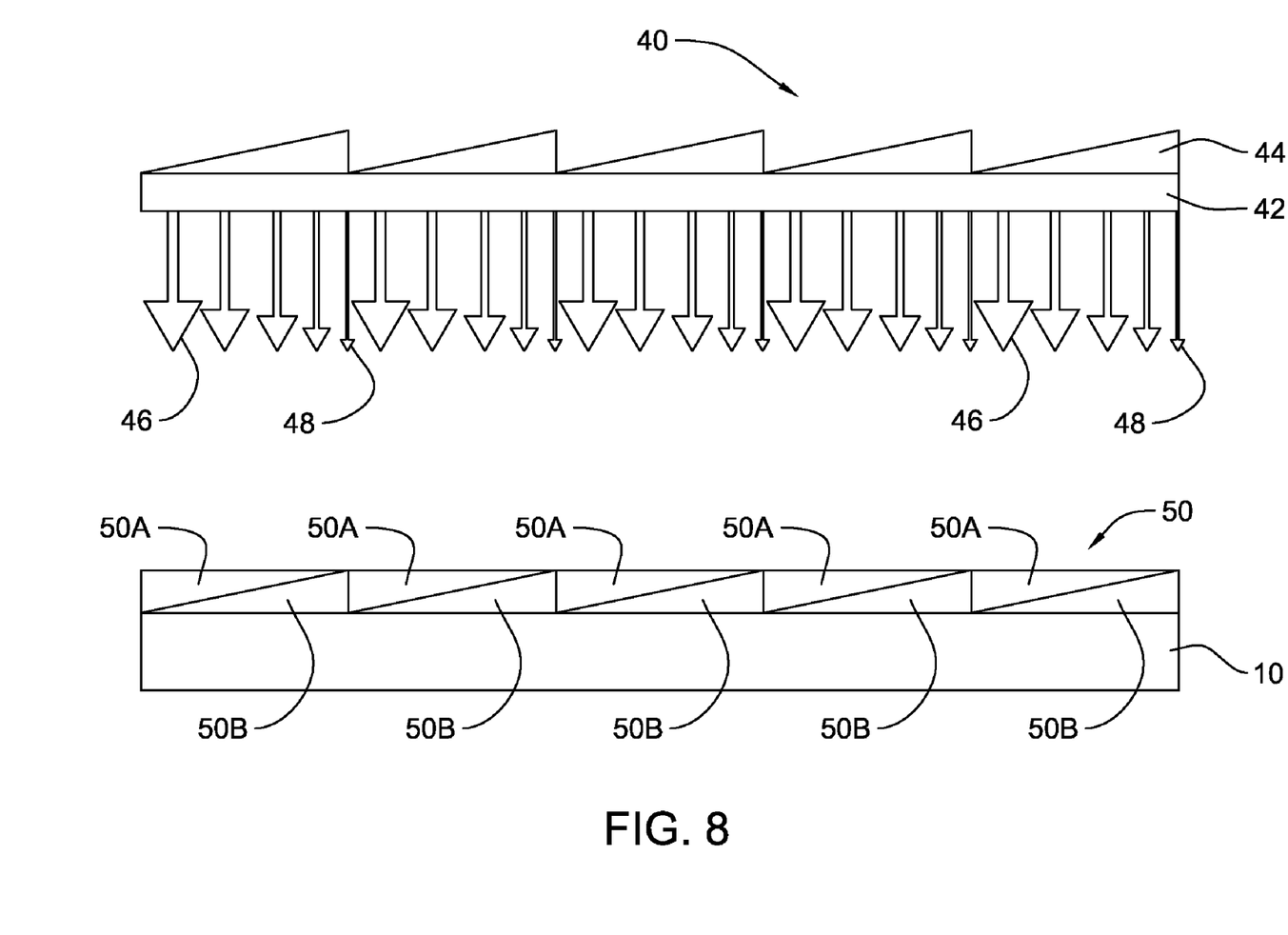
FIG. 8 is an enlarged cross-sectional view that illustrates etching with an analog mask.

Referring to FIG. 8, the formation of a structure in accordance with the invention by one embodiment of greyscale photolithography is illustrated. A grayscale photomask 40 includes a glass substrate 42 and regions of variable light transmission 44. Such variable light transmission is accomplished through the controlled etching of, for example, chrome coated glass or quartz photomasks, such that the Cr thickness is varied in opacity to allow for varied intensities of light to be transmitted through the photomask in selected regions. Thicker arrows 46 represent higher intensity light transmission, and thinner arrows 48 represent lower intensity light transmission. The variable light intensity, varying periodically with position along the length of photomask 40, is used to pattern at least one photosensitive layer 48, such as a photoresist on a substrate 10, resulting in regions with variable depths of photoreaction to the light which is proportional to the intensity of the light in that region that was transmitted through the photomask 40. When the photosensitive layer 48 is developed, a three dimensional shape is formed on the surface, such as a wedge or if repeated at intervals, a saw tooth structure. Specifically, regions 50A are removed, while regions 50B remain. The resulting structure having a wedge or saw tooth shape, is used as an etch mask to transfer this saw tooth structure into the underlying substrate 10 through the use of a suitable etchant including a chemical or plasma etchant. Specifically, the resulting structure is etched into the wedge or saw tooth shape with a chemistry which will etch both photoresist and thin film.

Figure 9:
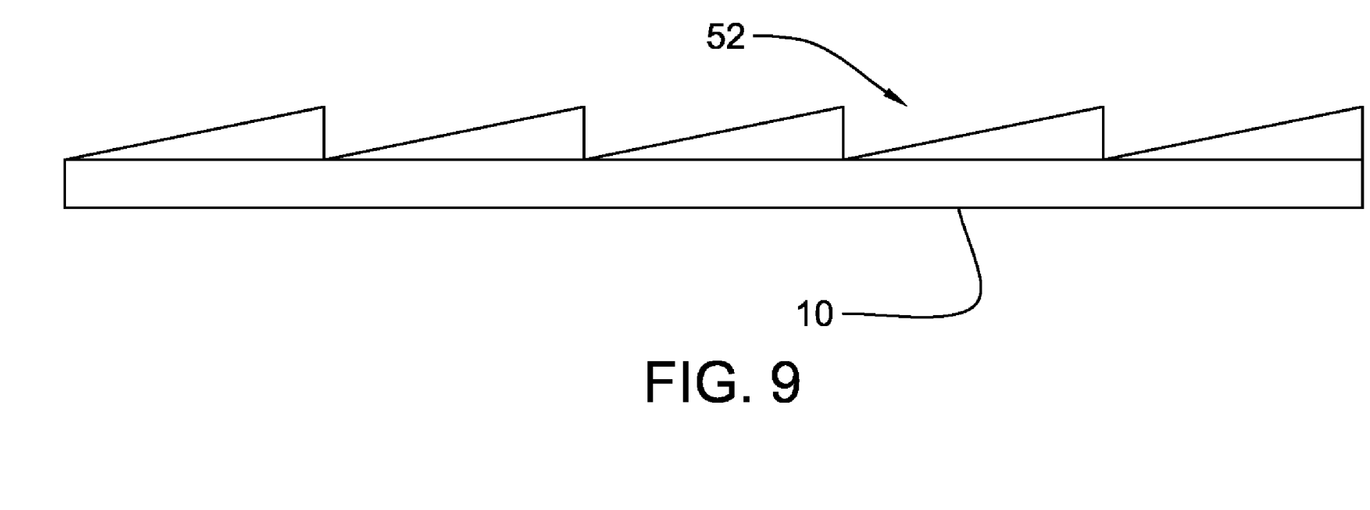
FIG. 9 is an enlarged cross-sectional view that illustrates the structure produced by the method illustrated in FIG. 8 after etching and cleansing.

Referring to FIG. 9, after etching and cleansing, the structure in accordance with the invention is a saw tooth pattern 52 on a substrate 10.

The saw tooth layer may also be formed by oblique deposition of film with patterned shadow masks. In this case the steps are 1) Deposit and define a shadow mask on the substrate with a desired geometry. 2) Oblique deposit a thin film. 3) Remove the shadow mask.

A polymer film can be molded on the substrate and then $SiN_x$ or another alignment layer can be deposited on the polymer film. Alternatively, the polymer film can be used as the alignment layer. Ion beam or other alignment treatment may be used.

In a manner similar to that discussed in the immediately preceding paragraph, the saw-tooth structure can be formed by printing or stamping.

The saw-tooth structure can be formed by directly scribing the substrate by microscribers or machining. This can be followed by an application of an optional alignment layer coating and treatment, as described above.

It will be understood that to be certain to reduce diffraction effects, in certain display structures, the periodicity of the saw tooth structures may be varied somewhat in random fashion over a certain number of the pixels to eliminate the interference pattern due to the periodic structures.

When the present invention is applied to active matrix liquid crystal display devices, the sloping or saw tooth structure of the present invention will be formed on the substrate on which the color filters are formed. The sloping or saw tooth structure generally cannot be applied to the substrate containing the thin film transistors. However, in passive matrix devices, where there are no thin film transistors on either substrate, designs may be envisioned where the sloping or saw tooth structure of the invention may be applied to both substrates.

For the simplicity of illustration, ITO or conducting electrodes layers are beneath the saw tooth structures (except FIG. 1A). However, it should be understood that all the embodiments and structures should apply to the cases where ITO or conducting electrodes are on top of the saw tooth structures, as shown in FIG. 1A.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A method for providing pre-tilt for liquid crystal molecules in a liquid crystal display having pixels, comprising:
forming a sloped surface on a substrate of said display, said sloped surface being in contact with liquid crystal molecules and causing pre-tilt of said molecules; wherein the sloped surface comprises a saw tooth structure with a dimension of the saw tooth structure selected to be large enough so that the liquid crystal molecules will not align along a direction of ridges of the saw tooth structure, and a period of the saw-tooth being substantially the same as a period of the pixels.

2. The method of claim 1, further comprising treating the sloped surface to increase pre-tilt angle of said molecules.

3. The method of claim 2, wherein said treatment comprises depositing an alignment layer over said sloped surface.

4. The method of claim 3, wherein said alignment layer is selected from the group consisting of $SiN_x$, SiOx, diamond like carbon film, SiC, a-Si, ITO, a dielectric material, polymer, and an optical material.

5. The method of claim 3, further comprising treating said alignment layer with an ion beam.

6. The method of claim 5, wherein the ion beam is directed to be perpendicular to ridges of the saw tooth structure and in a plane that forms an angle with respect to a plane of the substrate.

7. The method of claim 3, wherein said alignment layer is selected from the group consisting of $SiN_x$ SiOx, diamond like carbon film, SiC, a-Si, ITO, a dielectric material, polymer, and an optical material.

8. The method of claim 7, further comprising treating said alignment layer with an ion beam.

9. The method of claim 8, wherein the ion beam is directed to be perpendicular to ridges of the saw tooth and in a plane that forms an angle with respect to a plane of the substrate.

10. The method of claim 3, wherein said alignment layer is selected from the group consisting of $SiN_x$ SiOx, diamond like carbon film, SiC, a-Si and ITO.

11. The method of claim 1, wherein the saw tooth structure is formed by etching with a linear mask.

12. The method of claim 1, wherein the saw tooth structure is formed by deposition with a linear mask.

13. The method of claim 1, wherein the saw tooth structure is formed by ion milling with a shadow mask.

14. The method of claim 1, further comprising varying a dimension of a repeating unit of the saw tooth structure sufficiently so as to reduce diffraction of light.

15. The method of claim 1, wherein the saw tooth structure is formed by greyscale photolithography.

16. The method of claim 1, wherein the saw tooth structure is formed by one of angled RIE, oblique deposition of film with patterned shadow masks, molding a polymer film on the substrate, printing on the substrate, stamping the substrate, and scribing the substrate.

17. The method of claim 1, wherein the saw-tooth structure is formed of a material selected from the group consisting of an organic film, a polymer, an inorganic film, and a dielectric film.

18. The method of claim 1, further comprising treating the sloping surface to increase pre-tilt angle.

19. A liquid crystal display having pixels, comprising:
a first substrate;
a second substrate;
liquid crystal material disposed between said first substrate and said second substrate; and
a sloped structure on at least one of said substrates for providing a pre-tilt to molecules of said liquid crystal material; wherein the sloped surface comprises a saw tooth structure with a dimension of the saw tooth structure selected to be large enough so that the liquid crystal molecules will not align along a direction of ridges of the saw tooth structure, and a period of the saw-tooth being substantially the same as a period of the pixels.

20. The liquid crystal display of claim 19, further comprising an alignment layer disposed on said sloped structure.

21. The liquid crystal display of claim 20, further comprising an alignment layer disposed on said saw tooth structure.

22. The liquid crystal display of claim 21, wherein said alignment layer is selected from the group consisting of $SiN_x$ SiOx, diamond like carbon film, SiC, a-Si, and ITO.

* * * * *